(12) United States Patent
Mogi et al.

(10) Patent No.: US 6,351,367 B1
(45) Date of Patent: *Feb. 26, 2002

(54) ELECTROSTATIC HOLDING APPARATUS HAVING INSULATING LAYER WITH ENABLES EASY ATTACHMENT AND DETACHMENT OF SEMICONDUCTOR OBJECT

(75) Inventors: Hiroshi Mogi; Yoshikazu Ohtani; Kenichi Arai; Shinji Kojima; Toshimi Kobayashi, all of Gunma-ken (JP)

(73) Assignee: Shin-Etsu Chemical Co., Ltd., Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/163,081

(22) Filed: Sep. 29, 1998

(30) Foreign Application Priority Data

Sep. 30, 1997 (JP) ................................. 9-282640

(51) Int. Cl.[7] ........................... H01C 1/012; B25B 11/00
(52) U.S. Cl. ........................ 361/234; 338/308; 279/128; 29/825; 29/829
(58) Field of Search ................................ 361/233, 234; 279/128; 269/8; 29/825, 829; 338/308

(56) References Cited

U.S. PATENT DOCUMENTS 5,151,845 A * 9/1992 Watanabe et al. ........... 361/234
5,324,053 A * 6/1994 Kubota et al. ............... 279/128
5,329,161 A * 7/1994 Vines et al. ................. 257/764
5,382,469 A * 1/1995 Kubota et al. ............... 428/332
5,413,360 A * 5/1995 Atari et al. .................. 279/128
5,668,524 A * 9/1997 Aida et al. ................... 338/308
5,841,624 A * 11/1998 Xu et al. ..................... 361/234
5,903,429 A * 5/1999 Kobayashi et al. ......... 361/275.4

FOREIGN PATENT DOCUMENTS

| JP | 6294953 | 5/1987 | ............ H01L/21/68 |
| JP | 2206147 | 8/1990 | ............ H01L/21/68 |
| JP | 3147843 | 6/1991 | ............ B32B/18/00 |
| JP | 3204924 | 9/1991 | ......... H01L/21/302 |

* cited by examiner

Primary Examiner—Kim Huynh
(74) Attorney, Agent, or Firm—Hogan & Hartson, LLP

(57) ABSTRACT

There is disclosed an electrostatic holding apparatus in which a voltage is applied to an conductive electrode covered with an insulating dielectric layer in order to cause the insulating dielectric layer to electrostatically attract an object. The main component of the insulating dielectric layer is ceramic containing 0.1–30 wt. % of an atomic metal, and the volume resistivity of the metal-containing ceramic at 20° C. is $10^8$–$10^{13}$ $\Omega\cdot$cm. The metallic element is Mo or W. In the electrostatic holding apparatus, since the volume resistivity of an insulating dielectric layer of an electrostatic attraction portion is decreased, a strong electrostatic force can be generated. Also, there can be maintained the capability of allowing removal of an object at the time of stopping application of voltage. Further, since neither fine cracks nor pores remain in the insulating dielectric layer after sintering, the withstand voltage is high.

2 Claims, 1 Drawing Sheet

ELECTROSTATIC HOLDING APPARATUS HAVING INSULATING LAYER WITH ENABLES EASY ATTACHMENT AND DETACHMENT OF SEMICONDUCTOR OBJECT

BACKGROUND OF THE INVENTION

1. Field of the Invention

The present invention relates to an electrostatic holding apparatus, and more particularly to an electrostatic holding apparatus useful for a process performed during fabrication of semiconductor devices, liquid-crystal devices, etc., which apparatus can strongly attract and hold a conductive, semiconductive, or insulating object by means of electrostatic force and which enables easy attachment/detachment of the object.

2. Description of the Related Art

Recently, processes for fabricating semiconductor devices, liquid-crystal devices, etc.; especially processes of drying etching, ion implantation and vapor deposition, have been more and more automated and performed as dry processes. Under such circumstances, the number of fabrication processes performed under vacuum has increased.

Meanwhile, positional accuracy at the time of patterning has become more important since the diameters of silicon wafers and glass plates serving as substrates have increased and the degree of integration of circuits and the degree of fineness of patterns have increased. Therefore, vacuum chucks have been used to transport wafers or to attract and fix wafers. However, vacuum chucks have the following drawbacks. Vacuum chucks cannot be used under a vacuum environment because of impossibility of creating a pressure difference. Although vacuum chucks can be used under a non-vacuum environment, a sucked wafer undergoes a local distortion because the wafer is sucked locally, with the result that accurate positioning becomes difficult. Therefore, vacuum chucks are not suitable for recently developed processes for fabricating semiconductor devices and liquid-crystal devices.

Recently, as a device that has overcome the above-described drawbacks, there has been widely noticed and put into practical use an electrostatic holding apparatus which transports and/or attracts and fixes a wafer by means of electrostatic force. In a recent process for fabricating semiconductor devices and liquid-crystal devices, with an increase in the degree of fineness of devices, the flatness of wafers and glass plates serving as substrates has become more and more important. Therefore, employment of electrostatic holding apparatuses has been considered in order to perform a straightening correction for improving the flatness of wafers and glass plates.

Such a straightening correction for improving the flatness of wafers and glass plates requires a very strong electrostatic force. In order to meet such a requirement, there has been proposed a technique in which titania ($TiO_3$) is mixed into an insulating material such as alumina in order to decrease the volume resistivity to thereby increase the electrostatic attraction force (see Japanese Patent Application Laid-Open (kokai) Nos. 62-94953, 2-206147, 3-147843, and 3-204924).

As described above, when alumina containing titania is used for an insulating dielectric layer of an electrostatic attraction portion, the volume resistivity of the insulating dielectric layer decreases, and a small current flows therethrough, so that an increased electrostatic force is generated due to the Johnson-Rahbek effect. However, since titania is a semiconducting substance, movement velocity of charges decreases, so that even when the volume resistivity is optimized, the response characteristics (time required for reaching saturated attraction force, time required for annihilation of residual attraction force) at the time of stopping application of voltage deteriorate. Consequently, an article becomes difficult to remove from the attraction surface of the electrostatic holding apparatus. This deterioration in the response characteristics becomes remarkable when the electrostatic holding apparatus is used at low temperature. Further, due to a difference in coefficient of thermal expansion between titania and alumina, cracks and/or pores are generated in sintered alumina, so that the withstanding voltage is low.

SUMMARY OF THE INVENTION

The present invention has been accomplished to solve the above-mentioned problems, and an object of the present invention is to provide an electrostatic holding apparatus in which the volume resistivity of an insulating dielectric layer of an electrostatic attraction portion is decreased to increase an electrostatic force, which does not suffer deterioration in the capability of allowing removal of an object at the time of stopping application of voltage, in which neither fine cracks nor pores remain in the insulating dielectric layer after sintering, and which is therefore excellent in terms of withstand voltage.

To achieve the above object, the present invention provides an electrostatic holding apparatus in which a voltage is applied to an conductive electrode covered with an insulating dielectric layer in order to cause the insulating dielectric layer to electrostatically attract an object, wherein the main component of the insulating dielectric layer is ceramic containing 0.1–30 wt. % of an atomic metal, and the volume resistivity of the metal-containing ceramic at 20° C. is $10^8$–$10^{13}$ $\Omega$·cm.

If the main component of the insulating dielectric layer is ceramic containing 0.1–30 wt. % of an atomic metal, the volume resistivity of the insulating dielectric layer at 20° C. can be controlled easily and precisely to fall within the range of $10^8$–$10^{13}$ $\Omega$·cm. As a result, it becomes possible to form an electrostatic attraction portion which produces a strong electrostatic force, while enabling easy removal of an object; which has a reduced coefficient of thermal expansion; in which neither fine cracks nor pores remain in the insulating dielectric layer after sintering; and which therefore has a high withstand voltage.

Preferably, the atomic metal is molybdenum or tungsten.

If ceramic containing 0.1–30 wt. % of Mo or W as an atomic metal is used, the volume resistivity of the insulating dielectric layer at 20° C. can be brought into the range of $10^8$–$10^{13}$ $\Omega$·cm. As a result, it becomes possible to form an electrostatic attraction portion which produces a strong electrostatic force, while enabling easy removal of an object; which has a reduced deference in coefficient of thermal expansion; in which neither fine cracks nor pores remain in the insulating dielectric layer after sintering; and which therefore has a high withstand voltage.

Preferably, the ceramic of the insulting dielectric layer is a ceramic material selected from the group consisting of aluminum nitride, aluminum oxide, silicon nitride, silicon oxide, zirconium oxide, titanium oxide, sialon, boron nitride, and silicon carbide, or a mixture of two or more kinds of ceramic materials selected from the group.

When the ceramic of the insulting dielectric layer is selected from the above-described group, the addition of the above-described single metal to the ceramic makes it possible to obtain an increased electrostatic force and to enhance heat resistance and plasma resistance. Further, since the difference in coefficient of thermal expansion between the ceramic and the atomic metal mixed therein can be decreased to a possible extent, neither distortions nor cracks are generated in the attraction surface of the electrostatic attraction portion after a sintering process, so that the withstand voltage characteristic is improved. As a result, defects such as distortions and cracks are reliably prevented from being generated in a substrate (e.g., semiconductor wafer or glass plate) that is attracted and held by means of the electrostatic holding apparatus.

In the electrostatic holding apparatus according to the present invention, the insulating dielectric layer of the electrostatic attraction portion for attracting an object is formed of ceramic containing 0.1–30 wt. % of Mo or W, and the volume resistivity of the insulating dielectric layer at 20° C. is controlled to fall within the range of $10^8$–$10^{13}$ $\Omega \cdot cm$. Accordingly, the electrostatic holding apparatus produces a strong electrostatic force, while enabling easy removal of the object. Further, since the coefficient of thermal expansion of the insulating dielectric layer is substantially equal to that of AlN or SiC, neither fine cracks nor pores remain in the insulating dielectric layer after sintering, so that the electrostatic holding apparatus provides high performance and has excellent characteristics, including high withstand voltage. Therefore, the electrostatic holding apparatus of the present invention has a great industrial utility.

DESCRIPTION OF THE PREFERRED EMBODIMENT

Figure 1:
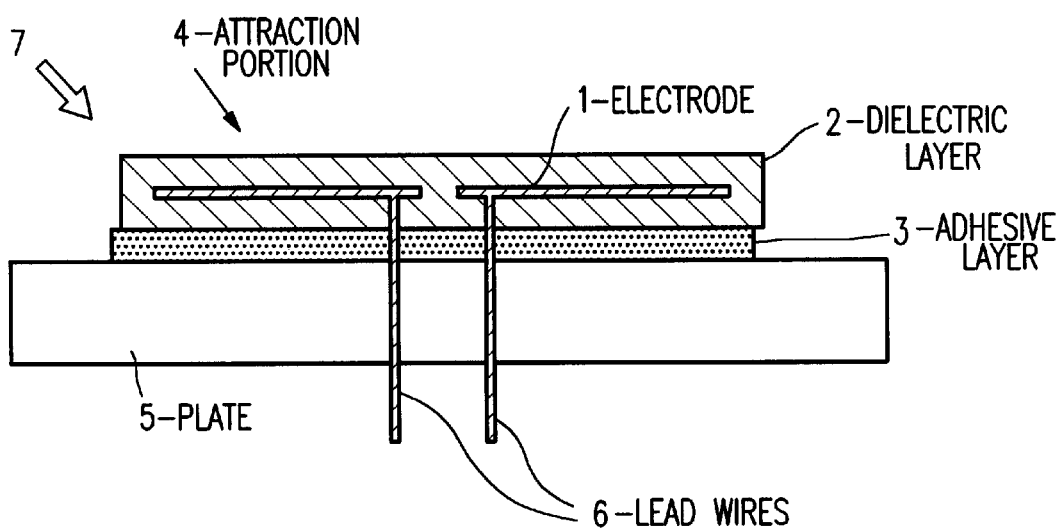
FIG. 1 is a vertical cross-sectional view showing an example of an electrostatic holding apparatus according to the present invention.

An embodiment of the present invention will next be described in detail, which, however, should not be construed as limiting the invention.

The inventors of the present invention considered that the material of an insulating dielectric layer of an electrostatic holding apparatus must be changed in order to improve the characteristics of the electrostatic holding apparatus, which are such that, although a strong electrostatic attraction force is generated, removal of an attracted object is difficult and the withstand voltage is decreased due to generation of fine cracks and pores in the insulating dielectric layer. Based on the above-described consideration, the inventors conceived that if the material of the insulating dielectric layer is changed to ceramic containing a specific amount of a single metal, specifically Mo or W, it becomes possible to manufacture a long-life and high-performance electrostatic holding apparatus which generates a strong electrostatic attraction force, which enables easy removal of an attracted object, and in which neither fine cracks nor pores are generated in the insulating dielectric layer, which otherwise decrease the withstand voltage. Based on this concept and through thorough investigations of other conditions, the present invention was completed.

FIG. 1 shows a vertical cross-sectional view of an electrostatic holding apparatus 7 according to the present invention.

The electrostatic holding apparatus 7 includes an electrostatic attraction portion 4 bonded to the top surface of a plate portion 5 via an adhesive layer 3. The electrostatic attraction portion 4 has a plate-like structure such that opposite sides of a bipolar electrode 1 are coated with an insulating dielectric layer 2. When a voltage from an external power supply is applied to the electrode 1 via lead wires 6, an electrostatic force is generated between the top surface of the electrostatic attraction portion 4 and an object (e.g., a semiconductor wafer) placed thereon. Thus, the object is strongly held, while straightening correction is performed to improve the flatness of the object.

The main component of the insulating dielectric layer 2—which constitutes the electrostatic attraction portion 4—is ceramic containing 0.1–30 wt. % of an atomic metal. Preferably, the atomic metal is molybdenum (Mo) or tungsten (W).

When the main component of the insulating dielectric layer is ceramic containing Mo or W, the volume resistivity of the insulating dielectric layer at 20° C. can be controlled easily and precisely to fall within the range of $10^8$–$10^{13}$ $\Omega \cdot cm$. As a result, it becomes possible to form an electrostatic attraction portion 4 which produces a strong electrostatic force, while enabling easy removal of an object; whose coefficient of thermal expansion is as small as that of aluminum nitride, silicon carbide, or the like; in which neither fine cracks nor pores remain in the insulating dielectric layer after sintering; and which therefore has a high withstand voltage.

As described above, in the conventional technique, a few to 25 wt. % of titania ($TiO_2$) is mixed into alumina ($Al_2O_3$) in order to adjust the volume resistivity of the insulating dielectric layer at room temperature to fall within the range of $10^9$–$10^{11}$ $\Omega \cdot cm$, thereby increasing the electrostatic force. However, since titania is a semiconductor substance, movement velocity of charges decreases, so that even when the volume resistivity is optimized, the response characteristics (time required for reaching saturated attraction force, time required for annihilation of residual attraction force) at the time of stopping application of voltage deteriorate. Consequently, an article becomes difficult to remove from the attraction surface of the electrostatic holding apparatus. Further, due to a difference in coefficient of thermal expansion between titania and alumina, fine cracks and/or pores are generated in sintered alumina, so that the withstand voltage becomes low.

In view of the foregoing, the present inventors investigated and searched for atomic metals and metal oxides, other than titania, which can be used as an additive for decreasing the volume resistivity of ceramic to a proper value and found that Mo and W are very effective for this purpose. Further, the inventors obtained the relationship between the incorporation amount of the additive and the volume resistivity of ceramic and confirmed that the resultant ceramic has physical properties suitable for the electrostatic attraction portion. Thus, ceramic having the above-described composition was employed.

For the ceramic of the insulting dielectric layer 2 of the electrostatic attraction portion 4, there can be used a ceramic material selected from the group consisting of aluminum nitride, aluminum oxide, silicon nitride, silicon oxide, zirconium oxide, titanium oxide, sialon, boron nitride, and silicon carbide, or a mixture of two or more kinds of ceramic materials selected from the group.

In the present invention, Mo or W is mixed into a ceramic material or materials in order to adjust the volume resistivity to a desired value, so that an insulating dielectric layer that generates a strong electrostatic force can be formed.

A proper value of the volume resistivity of the insulting dielectric layer 2—which constitutes the electrostatic attraction portion 4—varies depending on the temperature of use. For example, at the temperature of a semiconductor wafer to be held is 20° C. or less, a sufficiently strong electrostatic force is generated and device damage does not occur if the volume resistivity of the insulting dielectric layer 2 falls within the range of $1\times10^8$–$1\times10^{12}$ Ω·cm. This low temperature characteristic was investigated as follows.

Mo or W was added to a mixture of 95 wt. % of aluminum nitride powder and 5 wt. % of yttrium oxide powder serving as sintering aids in order to prepare an insulting dielectric powder. The amount of the Mo or W was varied in the range of 0.1–30 wt. % in order to obtain insulting dielectric powders having different volume resistivities (20° C.) within the range of $1\times10^7$–$9\times10^{12}$ Ω·cm. An electrode was buried in the insulting dielectric powder in order to fabricate an electrostatic attraction portion. The electrostatic attraction portion was maintained at a temperature of about −10° C. and the temperature of a wafer was decreased to 0° C. In this state, a 1 kV dc voltage was applied to the electrostatic holding apparatus in order to determine whether the electrostatic holding apparatus can hold the wafer and whether damage is generated on the wafer. The results of the experiment are shown in Table 1.

TABLE 1

| Volume resistivity (Ω · cm) | $1 \times 10^7$ | $2 \times 10^8$ | $5 \times 10^{11}$ | $9 \times 10^{12}$ |
|---|---|---|---|---|
| Holding state of wafer | Good | Good | Good | Fallen |
| Device damage | Broken | Good | Good | — |

Further, when the volume resistivity of the insulating dielectric layer 2 is adjusted to fall within the range between $1\times10^{12}$–$1\times10^{13}$ Ω·cm at the time when the temperature of a wafer to be held is 20° C. or higher, leakage current flowing through the wafer is small, so that a circuit formed on the wafer is not broken.

Also, a heat resistance test was performed as follows.

The incorporation amount of Mo or W was varied in the range of 0.1–30 wt. % in order to prepare electrostatic attraction portions in which the volume resistivity (20° C.) of the insulting dielectric layer was adjusted within the range of $1\times10^{11}$–$5\times10^{13}$ Ω·cm. The electrostatic attraction portion was heated and maintained at a temperature of about 110° C., and the temperature of a wafer was increased to 100° C. In this state, a 1 kV dc voltage was applied to the electrostatic holding apparatus in order to determine whether the electrostatic holding apparatus can hold the wafer and whether damage is generated on the wafer. The results of the experiment are shown in Table 2.

TABLE 2

| Volume resistivity (Ω · cm) | $1 \times 10^{11}$ | $3 \times 10^{12}$ | $2 \times 10^{13}$ | $5 \times 10^{13}$ |
|---|---|---|---|---|
| Holding state of wafer | Good | Good | Good | Fallen |
| Device damage | Broken | Good | Good | — |

The results of the above-described experiments and investigations revealed the following. The insulating dielectric material for an electrostatic chuck preferably has a volume resistivity that is adjusted within the range of $1\times10^8$–$1\times10^{13}$ Ω·cm, more preferably within the range of $1\times10^{10}$–$1\times10^{12}$ Ω·cm. When the incorporation amount of Mo or W is less than 0.1 wt. %, the volume resistivity does not decrease sufficiently, so that the electrostatic force becomes too weak and therefore a wafer cannot be held. When the incorporation amount of Mo or W exceeds 30 wt. %, the volume resistivity decreases excessively, so that the electrostatic force becomes excessively strong and therefore damage is generated in the wafer. Accordingly, the incorporation amount of Mo or W is determined to be within the range of 0.1 to 30 wt. %.

When the electrostatic attraction portion is fabricated such that the volume resistivity of the insulating dielectric layer whose main component is Mo or W-containing ceramic falls within the range of $1\times10^8$–$1\times10^{13}$ Ω·cm, the electrostatic attraction portion allows a wafer to be easily removed immediately after stoppage of application of voltage. Therefore, the electrostatic attraction response and release response of the electrostatic holding apparatus are quite good.

The electrostatic force is generally represented by the following equation:

$$F=A\cdot\epsilon\cdot(V/t)^2$$

where F: electrostatic force (C), $\epsilon$: dielectric constant (F/m), V: applied voltage (V), t: thickness ($\mu$m), and A: constant.

Therefore, ceramic powder having a high dielectric constant such as barium titanate, lead titanate, zirconium titanate, or PLZT (lead zirconate titanate lantern) may be added to the insulating material in an amount that does not cause generation of damage to semiconductor devices to be held.

The electrostatic attraction portion 4 was prepared as follows. First, powder of metal (Mo or W), a binder, and a solvent were mixed into ceramic powder to form a green sheet. Screen printing was then performed to print an electrode 1 on one surface of the green sheet through use of metal powder paste. Subsequently, a different green sheet superposed on the green sheet and was unified therewith through application of pressure by means of a high-pressure press, followed by sintering at a high temperature. Thus, a sintered body was obtained. Finally, opposite sides of the sintered body were precisely polished to obtain a plate-shaped shaped electrostatic attraction portion 4. Alternatively, a metallic plate or conductive ceramic sheet is prepared as the electrode 1, and insulating ceramic is thermal-sprayed on both sides thereof to a desired thickness in order to form a plate shape, both sides of which are then polished accurately to complete the electrostatic attraction portion 4.

The conductive electrode 1 that constitutes the electrostatic attraction portion 4 is formed of a material selected from a group consisting of metals such as aluminum, iron, copper, silver, gold, titanium, tungsten, molybdenum, and platinum, and conductive ceramics such as graphite, carbon, silicon carbide, titanium nitride, and titanium carbide, or an alloy of two or more materials selected from the group, or a mixed sintered body of these materials.

A screen printing method, a spraying and fusing method, a photo-lithography method, a plating method, or the like is used to form the electrode 1. In order to form an attraction electric field, there may be used a monopolar type electrode in which an object to be attracted is used as one electrode, and the other electrode is placed within the electrostatic attraction portion 4, or a bipolar type electrode in which two electrodes are placed within the electrostatic attraction portion 4.

Since voltage must be applied to the internal electrode 1 in order to generate an electrostatic force, holes communicating with the internal electrode 1 are formed in the ceramic which covers the electrode, and lead wires are connected from the external power supply to the electrode 1. When the electrode is formed of a solderable material such as copper, platinum, or nickel-plated or gold-plated tungsten, the lead wires are soldered to the electrode through use of solder having a melting point higher than the operating temperature of the electrostatic chuck. When the electrode is formed of an insolderable material such as graphite, tungsten, or titanium nitride, threaded pins are formed of an alloy having a coefficient of thermal expansion equal to that of the ceramic, and the pins are inserted to the holes and silver-brazed to the electrodes.

Since the electrostatic attraction portion 4 has a thin-plate like shape and is easily broken, the plate portion 5 must serve as a reinforcing plate. Also, the plate portion 5 must have a high heat conductivity in order to effectively radiate heat and must have a small coefficient of thermal expansion so as not to impart distortion or warp to the electrostatic attraction portion 4. Therefore, the plate portion 5 is preferably formed of a material selected from the group of consisting of aluminum oxide, aluminum nitride, silicon nitride, silicon oxide, zirconium oxide, titanium oxide, sialon, boron nitride, and silicon carbide, or a mixed sintered material of two or more kinds of materials selected from the group. There can be used a laminated plate obtained through integration of the above ceramic plate and a metallic plate such as an Al plate, Cu plate, or Ti plate, or an alloy plate such as a stainless plate.

Generally, a thermosetting synthetic resin adhesive having a high heat resistance is used for bonding between the electrostatic attraction portion 4 and the plate portion 5. If an adhesive that is in a liquid state at room temperature is used, the electrostatic attraction portion 4 and the plate portion 5 can be joined uniformly and easily, and adhesive bonding becomes usable regardless of the shapes of the electrostatic attraction portion 4 and the plate portion 5. Various application methods such as spin coating, bar coating, and spray coating may be used for application of the liquid adhesive.

EXAMPLES

The present invention will now be described by way of example. However, the present invention is not limited thereto.

Example 1

20 parts by weight of molybdenum powder, 8 parts by weight of butyral resin, 60 parts by weight of ethanol, and 12 parts by weight of dioctyl phthalate were added to 100 parts by weight of a mixture of 95 wt. % of aluminum nitride powder and 5 wt. % of yttrium oxide powder serving as a sintering aid, and the resultant mixture was then kneaded in a ball mill for 50 hours to yield slurry.

The slurry was then treated by a vacuum debubbling machine, and part of the solvent was evaporated in order to adjust the viscosity to 30,000 cps. Then, a green sheet having a thickness of 0.7 mm was formed through use of a doctor blade, and two circular sheets having a diameter of 180 mm were cut from the green sheet. A bipolar electrode was printed on one of the circular sheets by means of screen printing and through use of tungsten paste such that concentric electrodes that constitute the bipolar electrode were formed with a spacing of 2.5 mm therebetween. Also, a hole having a diameter of 2 mm was formed in the center portion of the other green sheet.

The green sheet having the hole was superposed on the green sheet having the printed electrode, and by use of a press which had been heated to 100° C., a pressure of 80 kg/cm$^2$ was applied to the superposed sheets in order to unify the sheets. Subsequently, the unified green body was sintered at a temperature of 1800° C. in an atmospheric gas containing 25 vol. % hydrogen and 75 vol. % nitrogen. Opposite surfaces of the resultant sintered body were polished in order to prepare an electrostatic attraction portion having a thickness of 1 mm. The volume resistivity of the electrostatic attraction portion measured at 20° C. was $2 \times 10^{10}$ Ω·cm. No fine cracks, pores, or warpage was observed on the sintered ceramic layer.

Subsequently, portions of the tungsten electrodes exposed through the holes formed in the electrostatic attraction portion were plated with nickel and gold, respectively, and two lead wires were soldered to these portions through use of a solder having a melting point of 350° C. Thus a electrostatic holding apparatus was manufactured.

Next, a silicon wafer having a diameter of 6 inches was placed on the electrostatic holding apparatus, and a voltage of DC±1 kV was applied between the two lead wires while the wafer was maintained at 0° C. In this state, the electrostatic force of the electrostatic holding apparatus was measured by use of an electrostatic force tester. The result of the measurement indicates that the electrostatic holding apparatus generates an electrostatic force of 2 kg/cm$^2$, which is sufficiently strong for straightening correction to improve the flatness of the wafer. When the applied voltage was shut off, the electrostatic holding apparatus quickly followed so that the wafer could be removed immediately after the stoppage of application of the voltage.

Example 2

An electrostatic attraction portion was manufactured in the same manner as in Example 1, except that the incorporation amount of molybdenum was changed to 10 parts by weight. The volume resistivity of the electrostatic attraction portion measured at 20° C. was $5 \times 10^{11}$ Ω·cm In order to evaluate the heat resistance, the electrostatic force of the electrostatic holding apparatus was measured by use of an electrostatic force tester, while the wafer temperature was heated to 100° C. The measured electrostatic force was 4 kg/cm$^2$, which is sufficient for practical use. A circuit formed on the wafer was not damaged by leakage current.

Comparative Example

An electrostatic attraction portion was manufactured in the same manner as in Example 1, except that in place of molybdenum, 2.5 parts by weight of titania ($TiO_2$) was added and mixed into the mixture of 95 wt. % aluminum nitride powder and 5 wt. % yttrium oxide powder. The volume resistivity of the electrostatic attraction portion measured at 20° C. was $5 \times 10^{12}$ Ω·cm.

In order to evaluate the heat resistance, the electrostatic force of the electrostatic holding apparatus was measured by use of an electrostatic force tester, while the wafer temperature was heated to 100° C. The measured electrostatic force was 1 kg/cm$^2$, which is insufficient for practical use. A circuit formed on the wafer was considerably damaged, which is conceivably attributable to incorporation of titania.

The present invention is not limited to the above-described embodiment. The above-described embodiment is a mere example, and those having the substantially same structure as that described in the appended claims and providing the similar action and effects are included in the scope of the present invention.

What is claimed is:

1. An electrostatic holding apparatus in which a voltage is applied to a conductive electrode covered with an insulating dielectric layer in order to cause the insulating dielectric layer to electrostatically attract an object, wherein the main component of the insulating dielectric layer is ceramic containing 0.1–30 wt. % of molybdenum or tungsten in its atomic form, and the volume resisitivity of the metal-containing ceramic at 20° C. is $10^8$–$10^{13}$ Ω·cm.

2. An electrostatic holding apparatus according to claim 1, wherein the ceramic of the insulating dielectric layer is a ceramic material selected from the group consisting of aluminum nitride, aluminum oxide, silicon nitride, silicon oxide, zirconium oxide, titanium oxide, sialon, boron nitride, and silicon carbide, or a mixture of two or more kinds of ceramic materials selected from the group.

* * * * *